(12) United States Patent
Jost et al.

(10) Patent No.: US 12,191,134 B2
(45) Date of Patent: Jan. 7, 2025

(54) COMPACT TIME-OF-FLIGHT MASS ANALYZER

(71) Applicant: Spacetek Technology AG, Muri bei Bern (CH)

(72) Inventors: Jürg Jost, Gümlingen (CH); Lukas Hofer, Meilen (CH)

(73) Assignee: Spacetek Technology AG, Muri bei Bern (CH)

( * ) Notice: Subject to any disclaimer, the term of this patent is extended or adjusted under 35 U.S.C. 154(b) by 325 days.

(21) Appl. No.: 17/642,996

(22) PCT Filed: Oct. 22, 2020

(86) PCT No.: PCT/IB2020/059932
§ 371 (c)(1),
(2) Date: Mar. 15, 2022

(87) PCT Pub. No.: WO2021/079310
PCT Pub. Date: Apr. 29, 2021

(65) Prior Publication Data
US 2022/0344143 A1    Oct. 27, 2022

(30) Foreign Application Priority Data

Oct. 25, 2019  (GB) ...................................... 1915528

(51) Int. Cl.
*H01J 49/40*    (2006.01)
*H01J 49/06*    (2006.01)
(Continued)

(52) U.S. Cl.
CPC .......... *H01J 49/401* (2013.01); *H01J 49/068* (2013.01); *H05K 1/0233* (2013.01); *H05K 1/181* (2013.01); *H05K 2201/10151* (2013.01)

(58) Field of Classification Search
CPC ...... H01J 49/401; H01J 49/068; H01J 49/022; H05K 1/0233; H05K 1/181; H05K 2201/10151; H05K 2201/09072
See application file for complete search history.

(56) References Cited

U.S. PATENT DOCUMENTS

| 3,299,311 A | * | 1/1967 | Meyerer | ................. | H01J 41/20 |
| | | | | | 313/481 |
| 4,686,366 A | | 8/1987 | Stuke | | |

(Continued)

FOREIGN PATENT DOCUMENTS

| CN | 105931944 A | 9/2016 |
| CN | 107946166 A | 4/2018 |

(Continued)

OTHER PUBLICATIONS

International Search Report for Application No. PCT/IB2022/050087, four pages, dated Jul. 1, 2022.

(Continued)

*Primary Examiner* — David A Vanore
(74) *Attorney, Agent, or Firm* — Nixon & Vanderhye P.C.

(57) ABSTRACT

A set of acceleration electrodes for the acceleration of charged particles in a vacuum ion optical system, wherein each acceleration electrode comprises a conical section and at least an elongated leg protruding from the conical section, the elongated leg and any further elongated leg each being configured as a mechanical support and as an electrical connection between the conical section and an intended source of electric potential.

4 Claims, 4 Drawing Sheets

(51) Int. Cl.
  *H05K 1/02*  (2006.01)
  *H05K 1/18*  (2006.01)

(56) References Cited

U.S. PATENT DOCUMENTS

| | | | | |
|---|---|---|---|---|
| 4,718,076 | A * | 1/1988 | Doi | H05G 1/60 |
| | | | | 378/146 |
| 5,154,635 | A | 10/1992 | Kaufman et al. | |
| 5,274,727 | A * | 12/1993 | Ito | G02F 1/3775 |
| | | | | 359/332 |
| 5,367,429 | A * | 11/1994 | Tsuchitani | B81B 3/0008 |
| | | | | 361/280 |
| 5,818,055 | A | 10/1998 | Franzen | |
| 5,825,025 | A | 10/1998 | Kerley | |
| 5,864,137 | A * | 1/1999 | Becker | H01J 49/403 |
| | | | | 250/287 |
| 2002/0050776 | A1 * | 5/2002 | Kubota | H01J 9/025 |
| | | | | 445/24 |
| 2002/0063205 | A1 | 5/2002 | Green et al. | |
| 2004/0183007 | A1 | 9/2004 | Belov et al. | |
| 2006/0138395 | A1 | 6/2006 | Kohno et al. | |
| 2012/0217387 | A1 | 8/2012 | Loucks, Jr. et al. | |
| 2013/0256524 | A1 | 10/2013 | Brown et al. | |
| 2014/0008531 | A1 | 1/2014 | Furuhashi et al. | |
| 2016/0169180 | A1 * | 6/2016 | McAlister | F02M 61/08 |
| | | | | 239/584 |
| 2017/0062196 | A1 | 3/2017 | Iwasaki et al. | |
| 2022/0344143 | A1 * | 10/2022 | Jost | H05K 1/181 |

FOREIGN PATENT DOCUMENTS

| | | |
|---|---|---|
| EP | 1513185 A1 | 3/2005 |
| EP | 2 676 286 | 7/2006 |
| EP | 2690649 A1 | 1/2014 |
| GB | 2 329 066 | 3/1999 |
| GB | 2369721 A | 6/2002 |
| GB | 2481883 A | 1/2012 |
| GB | 2488429 A | 8/2012 |
| JP | 04-262356 A | 9/1992 |
| JP | 06-203791 A | 7/1994 |
| JP | 2000-067805 A | 3/2000 |
| JP | 2000-251830 A | 9/2000 |
| JP | 2001-351563 A | 12/2001 |
| JP | 2009-538501 A | 11/2009 |
| JP | 2013-114894 A | 6/2013 |
| JP | 2017-50279 A | 3/2017 |
| JP | 2017-527962 A | 9/2017 |
| TW | 201903823 A | 1/2019 |
| WO | 2012/112537 A2 | 8/2012 |
| WO | WO 2015019460 A1 | 2/2015 |
| WO | 2018/163576 A1 | 9/2018 |
| WO | WO-2021079310 A1 * | 4/2021 ............ H01J 49/022 |

OTHER PUBLICATIONS

Scherer, S. (1999). Design of a high-performance Reflectron time-of-flight mass spectrometer for space applications (Doctoral dissertation, University Bern-Switzerland).

Written Opinion of the ISA mailed on Apr. 13, 2021 for Application N° PCT/IB2020/059932.

Written Opinion of the ISA for PCT/IB2022/050087 mailed Jul. 1, 2022, 11 pages.

European Search Report for Application No. EP 21155560.2, dated Jul. 12, 2021, 5 pages.

Taiwanese Office Action with English Machine Translation for Application No. TW 109136988, 24 pages dated Jun. 21, 2024.

Balsiger, H., Altwegg, K., Bochsler, P., Eberhardt, P., Fischer, J., Graf, S., . . . & Wollnik, H. (2007) Rosina-Rosetta orbiter spectrometer for ion and neutral analysis. Space Science Reviews, 128(1), 745-801. https://doi.org/10.1007/s11214-006-8335-3. publication retrieved on Mar. 9, 2022.

British Examination Report mailed on Apr. 28, 2020 for UK Application N° 1915528.2.

British Search Report mailed on Apr. 28, 2020 for UK Application N° 1915528.2.

European Opinion mailed on Oct. 22, 2021, for Application N° EP21155560. 2.

European Search Report mailed on Oct. 22, 2021, for Application N° EP21155560. 2.

International Search Report mailed on Apr. 13, 2021 for Application N° PCT/IB2020/059932.

Küchler, A. (2005). Hochspannungstechnik Springer-Verlag, Berlin, https://doi.org/10.1007/978-3-540-78413-5 publication retrieved on Aug. 20, 2021.

McNaught, A. D. (1997). Compendium of chemical terminology (vol. 1669). Oxford: Blackwell Science. XML on-line corrected version: http://goldbook.iupac.org : homepage retrieved on Mar. 9, 2022.

Meyer, S., Tulej, M., & Wurz, P. (2016, Apr.). Mass spectrometry of planetary exospheres at high relative velocity: direct comparison of open-and closed source measurements. In EGU General Assembly Conference Abstracts (pp. EPSC2016-8536), https://doi.org/10.5194/gi-6-1-2017. publication retrieved on Mar. 9, 2022.

Japanese Office Action with English translation for Application No. JP 2022-552428, 12 pages, dated Aug. 23, 2024.

"UHV Kapton Insulated Wire and Cable", Accu-Glass Products, Inc., Jan. 26, 2021, pp. 1-3, XP055821553, Retrieved from the Internet: URL:http://web.archive.org/web/20210126120445/https://www.accuglassproducts.com/wire-and-cable/uhv-kaptonA®-insulated, author unknown.

* cited by examiner

COMPACT TIME-OF-FLIGHT MASS ANALYZER

CROSS REFERENCE TO RELATED APPLICATIONS

The present application is a United States national stage application of International patent application PCT/IB2020/059932 filed on Oct. 22, 2020 that designated the United States, and claims foreign priority to United Kingdom patent application GB 1915528.2 filed on Oct. 25, 2019, the contents of both documents being herewith incorporated by reference in their entirety.

TECHNICAL FIELD

This invention relates to a compact time-of-flight mass analyzer for a mass spectrometer for the determination of the chemical composition of liquid or gases.

BACKGROUND

In many domains of industrial application there is the need to measure the chemical composition of a substance, in the form of a liquid or gas, with a compact device that can be integrated inline of production equipment or infrastructure. For example, coating processes used in the manufacturing of semiconductors, optics, and displays need accurate process control, which can be achieved by measuring at high-rate, such as every fraction of a second, the composition of the gas that is delivered to the substrate in a vacuum deposition process.

Mass spectrometers are high-performance instruments that are typically used in a laboratory to determine the chemical composition of a gas or liquid. A Mass spectrometer is "an instrument in which beams of ions are separated according to the quotient mass/charge" [1]. A mass spectrometer works by directly measuring the positive or negative ions of atoms or molecules of a substance created inside the instrument ion source. These ions are then delivered to a mass analyzer that obtains a mass spectrum, where each atomic or molecular species can be identified by their characteristic spectrum represented on a calibrated scale of mass-to-charge ratio vs intensity.

A mass spectrometer can be used to monitor the chemical composition of a substance at regular time intervals, and therefore can be used as a sensor for process control. Mass spectrometers exist both as instruments that need to be operated by a human operator in the lab and as autonomous devices instruments that can automatically analyze a substance at defined time intervals and provide the results of this analysis to a computer system over a network. Examples of such devices include orifice inlet mass spectrometers, which use a small pinhole to transfer a gas sample in vacuum, and membrane inlet mass spectrometers, which use a membrane that is semi-permeable to the gas or liquid sample being analyzed.

There are different methods to separate ions by their mass-to-charge ratio. One method is to use a quadrupole filter that allows only ions with a certain mass-to-charge ratio to pass through it and hit a detector. By scanning a certain range of mass, a quadrupole mass spectrometer can generate a mass spectrum. These instruments can be very sensitive, but they are slow, because of the need to perform a scan of the mass spectrum which makes them able to produce a spectrum every, for example, 10 s or longer. In addition, to achieve high sensitivity in the measurement of samples that contains substances present in very low or trace amounts, which requires a capability to measure high as well as low signal, quadrupole mass spectrometers need to use gain switching, which is very challenging to implement in the electronics while ensuring that the instrument's measurement remains quantitative. Moreover, their manufacturing is challenging, as the bars of the quadrupole need precise mechanical alignment at the level of few micrometers to achieve the desired performance.

Another method to separate ions by their mass-to-charge ratio is to accelerate a group of ions from a sample with substantially the same kinetic energy into an ion-optical system that directs them towards a detector. Because all the ions start with substantially the same kinetic energy, but have different masses, their time of arrival at the detector will depend on their mass to charge ratio. Therefore, by measuring the time of arrival of the ions at the detector, using very-fast electronics, one can obtain a mass spectrum, hence the name of time-of-flight mass analyzers or spectrometers for this kind of devices. These instruments are very sensitive and fast, because they usually work at kHz repetition rate, meaning that they acquire thousands of spectra every second, which are then summed up inside the instrument electronics to produce a spectrum every, for example, 0.1 or 1 s, that is about ten or hundred times faster than a typical quadrupole mass spectrometer. Moreover, the whole spectrum in a time-of-flight mass spectrometer is acquired with the same gain setting of the detector, thus allowing for fast yet quantitative and sensitive measurements. These instruments, however, require high-performance electronics, in particular when the instrument is compact and the time of flight of the ions in the mass analyzer is short, in the order of few microseconds. Moreover, their performance is very sensitive to details of the design of the ion optics of the mass analyzer. As a consequence, time-of-flight mass spectrometers are usually large and expensive instruments that are only found in high-end laboratories, but that are not used online of industrial manufacturing equipment for process control, whereby a compact size is important to allow for their integration inline of industrial manufacturing equipment. One the other hand, quadrupole mass spectrometers, despite their disadvantages, can be built small and hence are commonly used as process control instruments in industry.

The present invention aims at addressing the above described inconveniences. Thereby it enables the use of fast time-of-flight mass analyzers in fields of industry where previously only quadrupole mass spectrometers were used, thus opening new possibilities for faster and more sensitive process and product quality control in various domains of industrial application

SUMMARY OF THE INVENTION

In a first aspect, the invention provides a time-of-flight mass spectrometer comprising a time-of-flight mass analyzer, an ion source configured to produce a divergent ion beam, an extraction region configured for an orthogonal extraction of ions from a compensated ion beam into the time-of-flight mass analyzer, and transfer optics, placed between the ion source and the extraction region, that compensates for a divergence of the divergent ion beam to create the compensated ion beam such that it is substantially parallel or focused in the proximity of the extraction region.

In a preferred embodiment, the extraction region comprises a push electrode and a pull electrode configured to bend an ions' trajectory from the compensated beam by substantially 90 degrees, and acceleration electrodes enabled to accelerate the ions in direction of a drift region of the time-of-flight mass analyzer.

In a further preferred embodiment, the transfer optics comprises a plurality of electrodes arranged to enable for beam guidance to compensate any one of the list comprising a mechanical imperfection, and an ex-centered divergent ion beam, to change a direction of the divergent ion beam based on a setting of a voltage applied to them, and to cut away ions from the divergent ion beam, which are on diverging trajectories with respect to focusing abilities of the transfer optics.

In a further preferred embodiment, the plurality of electrodes comprises a first plurality of electrodes and a second plurality of electrodes arranged to surround the divergent ion beam and enabled for the beam guidance, a third plurality of electrodes and a fourth plurality of electrodes, placed at opposite sides with respect to the ion beam and arranged to surround substantially half of the divergent ion beam and enabled to change the direction of the divergent ion beam based on the setting of the voltage applied to them, a fifth plurality of electrodes, arranged as a skimmer, and enabled to cut away the ions from the divergent ion beam, which are on diverging trajectories with respect to focusing abilities of the transfer optics.

In a second aspect, the invention provides a set of acceleration electrodes for the acceleration of charged particles in a vacuum ion optical system, wherein each acceleration electrode comprises a conical section and at least an elongated leg protruding from the conical section, the elongated leg and any further elongated leg each being configured as a mechanical support and as an electrical connection between the conical section and an intended source of electric potential.

In a further preferred embodiment, the set of electrodes further comprises an insulating tube configured to house the acceleration electrodes in sequence, whereby successive acceleration electrodes have legs of increasing length as compared to a preceding acceleration electrode in the sequence, and the increasing length of the legs is configured to position the conical sections at determined distances among each other to obtain desired electrical fields between successive acceleration electrodes hence providing a concentric set of acceleration electrodes.

In a further preferred embodiment, the legs of the acceleration electrodes are mounted on a same support, which acts as a reference plane.

In a further preferred embodiment, the support onto which the set of electrodes is mounted is a printed circuit board.

In a third aspect, the invention provides a set of electrodes configured either as acceleration electrodes to accelerate ions in an ion optical system or as electrodes of a transfer optics, each electrode being mechanically fixed and electrically connected on a printed circuit board, whereby the printed circuit board further supports an implementation of noise filters in close proximity of a mechanical fixation of the electrodes.

In a further preferred embodiment, each electrode is mounted on the printed circuit board, by using legs of different length than the length of the legs of other electrodes.

In a further preferred embodiment, at least a subset of the electrodes is equipped with its own noise filter.

In a further preferred embodiment, the electrodes are mounted to form a sequence of aligned electrodes, and each electrode is mounted at a certain angle with respect to the previous one in the sequence.

BRIEF DESCRIPTION OF THE FIGURES

The invention will be better understood through the detailed description of preferred embodiments, and in reference to the appended figures, wherein.

Figure 1:
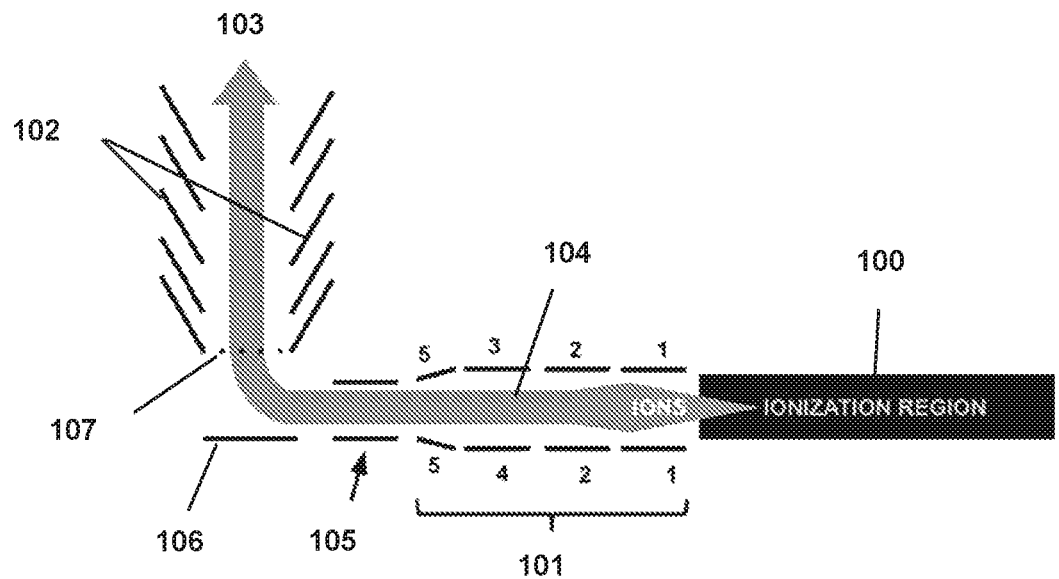
FIG. 1 depicts a cross section of an orthogonal ion injection part of the ion source of a time-of-flight mass analyzer, according to an example embodiment of the invention.

Same references will be used throughout the figures and description to designate same or similar objects.

DETAILED DESCRIPTION OF PREFERRED EMBODIMENTS

The present invention is relative to ion optics of a time-of-flight mass analyzer that improve the manufacturability and performance of a time-of-flight mass spectrometer, particularly when a compact instrument is concerned. Moreover, it discloses a way to couple an ion source originally designed for a quadrupole mass analyzer with a time-of-flight mass analyzer, which makes it very easy to replace slow quadrupole mass analyzers used in industrial process control with a new fast time-of-flight mass analyzer, with minimal changes to the existing interfaces between these measurement instruments and the industrial manufacturing equipment that they are interfaced with. All these features allow to use fast time-of-flight mass analyzers in fields of industry where previously only quadrupole mass spectrometers were used, thus opening new possibilities for faster and more sensitive process and product quality control in various domains of industrial application.

In one aspect, the present invention relates to a device configured to couple an ion source originally conceived for a quadrupole mass analyzer, with a time-of-flight mass analyzer, which allows to replace a low-performance quadrupole mass filter with a high-performance time-of-flight mass analyzer with minimal changes to said existing instrument, thus providing a significant ease of upgrade of existing instruments with faster and more sensitive analyzers.

The quadrupole mass analyzer technology requires a continuously running ion source, which injects the generated ions under an angle of a few degrees into the quadrupole analyzer. Hereafter, we call such a device quadrupole ion source. But having such a diverging ion beam does not allow to interface an existing quadrupole ion source with a time-of-flight mass analyzer, because the mass resolution is compromised when the ions have a velocity component into the direction of extraction of the ions due to their divergence. A nearly parallel ion beam is required for the time-of-flight mass analyzer to achieve high-resolution mass spectra because the initial time spread of the ions in the ion source is critical for the later separation by mass.

A known technique to interface a continuous ion sources, such as an electro-spray ionization source, with time-of-flight mass analyzers is the so called orthogonal extraction, in which ions are introduced into the extraction region of the ion source of the time-of-flight mass analyzer perpendicularly to the direction of extraction. The orthogonal extraction allows to handle high ion or gas density of a continuous ion source, such as an electro-spray ionization source, while preventing the operation of the mass analyzer at excessive pressure, which constitutes a performance and a safety issue, because of the increased risk of discharges between high-voltage elements found in a time-of-flight mass analyzer. Operating the mass analyzer at too-high pressure reduces the mean free path of the ions flying through said analyzer, thus reducing the sensitivity of the instrument. Another reason to use orthogonal extraction is to measure ions that are too fast for achieving high quality mass spectra with a straight ion source, such as ions in atmosphere of a planetary object or comet [2] [3], because in a straight ion source it would not be possible to keep said fast ions and reduce their time spread to achieve good initial conditions for performing a high-resolution mass spectrometric analysis.

The present invention discloses a new type of orthogonal extraction which allows to guide the initially diverging ions of a quadrupole ion source into the extraction region of a time-of-flight analyzer by forming the ions into a compensated ion beam, which is substantially parallel, and at the same time obtain all the advantages mentioned above of an orthogonal extraction ion source, The invention comprises a combination of

- a quadrupole ion source producing a divergent ion beam,
- a region for the orthogonal extraction of ions into the ion optics of the time-of-flight mass analyzer, and
- a transfer optics, placed between said ion source and said extraction region, that compensates for the divergence of the ion beam to create a beam that is nearly parallel or focused in the proximity of the extraction region.

The transfer optics is a set of electrodes, which is used to guide the diverging ion beam to the extraction region of the time-of-flight mass analyzer and form a nearly parallel compensated beam. This transfer optics electrodes also acts as an electrostatic lens by geometrically focusing the ions towards the extraction region.

Any number of electrodes may be used to achieve the described effect of compensation of the beam divergence, to a sufficient extent to create a nearly parallel ion beam that allows to couple the quadrupole ion source with the extraction region of the time-of-flight mass analyzer and achieve a sufficient performance or mass resolution. In a preferred embodiment as illustrated in FIG. 1, the set of electrodes constituting the transfer optics, comprises five electrodes referenced 1 to 5. FIG. 1 depicts the cross section of the orthogonal ion injection part of the ion source of the time-of-flight mass analyzer. On the right side of FIG. 1, a quadrupole ion source 100 is depicted, as known from prior art, which provides an ion beam 104. In the middle of FIG. 1, transfer optics 101 to interface the quadrupole ion source 100 with time-of-flight analyzer (the time-of-flight analyzer is not shown in FIG. 1) is visible, with its electrodes numbered from 1 to 5. The same number 1 to 5 appears several times and a same number indicates electrodes that are connected to the same power supply. The left part of FIG. 1 shows the extraction region where the ions' trajectory is bent by approximately 90 degrees by means of a backplane or push electrode 106 and a pull electrode 107, and the ions are then accelerated by acceleration electrodes 102 in direction 103 of the field-free drift region of the time-of-flight mass analyzer. In the middle part of FIG. 1, the first two electrodes, referenced 1 and 2, surround the ion beam 104 and act as beam guidance to compensate possible geometrical distortions of the beam due to mechanical imperfections, or a non-central ion creation. The third and fourth electrodes, referenced 3 and 4 in FIG. 1, surround approximately half of the ion beam 104 and are placed at opposite sides with respect to the ion beam 104, so that they can be used to change the direction of the ion beam 104 based on their voltage setting. The fifth electrode, referenced 5 in FIG. 1, acts as a skimmer, by cutting away ions which are on highly diverging trajectories for the focusing abilities of the transfer optics 101. At this point, the ion beam 104 enters the extraction region of the mass analyzer through an aperture 105 that is at the ground potential of the extraction region. Depending on the actual configuration of the instrument, the actual values of the voltage applied to each of these electrodes may vary. It may be positive or negative, depending on the polarity of the ions that are generated by the quadrupole ion source 100, but the voltage applied to these electrodes is generally set in a way to produce the ion beam 104 with an energy in the order of few electronvolt (eV). In a preferred embodiment, the electric potential applied to these electrodes is approximately in the range of −120 V to +120 V. These electrodes can have any shape that can be demonstrated, by ion optical simulation as it can be done with the SIMION software or by experiments, to produce a beam with the desired characteristics. Possible shapes of said electrodes include circular, elliptical, square, and rectangular shapes, or partial sections thereof.

When exchanging a quadrupole mass analyzer by a time-of-flight mass analyzer one would normally not use the quadrupole ion source that generates a diverging beam, and instead redesign said quadrupole ion source to place the region where the neutral gas is ionized (ionization region) in a confined space between or within electrodes of the orthogonal part to accelerate the created ions immediately and form them into a parallel ion beam. In contrast, the present invention allows to keep and operate the existing quadrupole ion source together with the time-of-flight analyzer, despite the adverse properties of the quadrupole ion source of generating a diverging ion beam. Surprisingly, the instrument so obtained is very stable and has a high-performance, despite using a component, the quadrupole ion source, that was originally optimized for a completely different instrument. Because in an existing instrument or product, the ion source is an inherent part of the sample introduction system, redesigning this part represents a substantial effort and a risk. In contrast, with the present invention both the quadrupole ion source and all the existing parts of the gas introduction system stay the same and the instrument can therefore be operated in a familiar way, without changes to the interfaces with the sample introduction system, yet with the additional performance that the time-of-flight mass analyzer can provide compared to the quadrupole mass analyzer.

In another aspect, the present invention relates to a device configured to accelerate ions, that, at the same time, is easy to assemble and minimizes the capacitive coupling between electrodes, thus reducing the noise (cross-talk) of high-frequency components of signals that are used or intercepted by the device. In a preferred embodiment, the present invention allows to reduce the noise caused by the high-voltage pulser used to extract the ions out of the ion source of the time-of-flight mass analyzer.

In the time-of-flight mass analyzer, an electric pulse is applied to an electrode in the ion source to extract by either pushing or pulling, or both pushing and pulling, the ions out of the source and accelerate them to their time-of-flight path for mass spectrometric analysis. The electrode may for example be a grid when it is used to pull the ions, and hence has to ensure that the ions can pass through when they are accelerated towards it. Alternatively, the electrode used to pull the ions may have a different shape, including holes, but with some disadvantage with respect to the uniformity of the electric field that it creates. The electric pulse may be a negative or a positive pulse, depending on the polarity of the ions that are created by the ion source, and typically has a height of a few hundreds of volts and rising and falling time in the order of a few nanoseconds. More than one electric pulse may be applied in particular instrument configurations, for example two electric pulses may be applied to push and pull the ions approximately simultaneously.

The performance of a time-of-flight mass analyzer depends critically on the steepness and sharpness of the edges of the electric pulse. Ideally, the electric pulse is a perfect square wave. In practice, the electric pulse or pulses applied to the ion source of the mass analyzer typically have a nearly rectangular shape.

Because a pulse with close to rectangular shape contains signal components over almost the complete frequency spectrum, the high-frequency parts of the high-voltage pulse has the potential to propagate through the whole mass spectrometer and cause noise. The propagation of this noise is favored by the presence of capacitive loads in the ion optics of the time-of-flight mass analyzers, because capacitors tend to be conductive to high-frequency signals. This propagation of noise is particularly critical for compact instrument, because the capacity is given by the formula C=epsilon*A/d, where epsilon is the permittivity of the dielectric medium between the two surfaces, A is the area of the two surfaces, and d is their distance. In a large instrument, there are larger electrodes, but also larger distances between the electrodes, but because capacity scales linearly with the area but non-linearly with the distance, it can be expected that the capacity coupling of neighboring electrodes is more critical for a compact instrument, thus being one of the reasons why it is very difficult to find such compact devices on the market. Therefore, it is desirable to minimize all the capacitive loads in the mass analyzer to minimize the noise and improve the quality of the mass spectra, particularly when a compact ion source is concerned.

Figure 2:
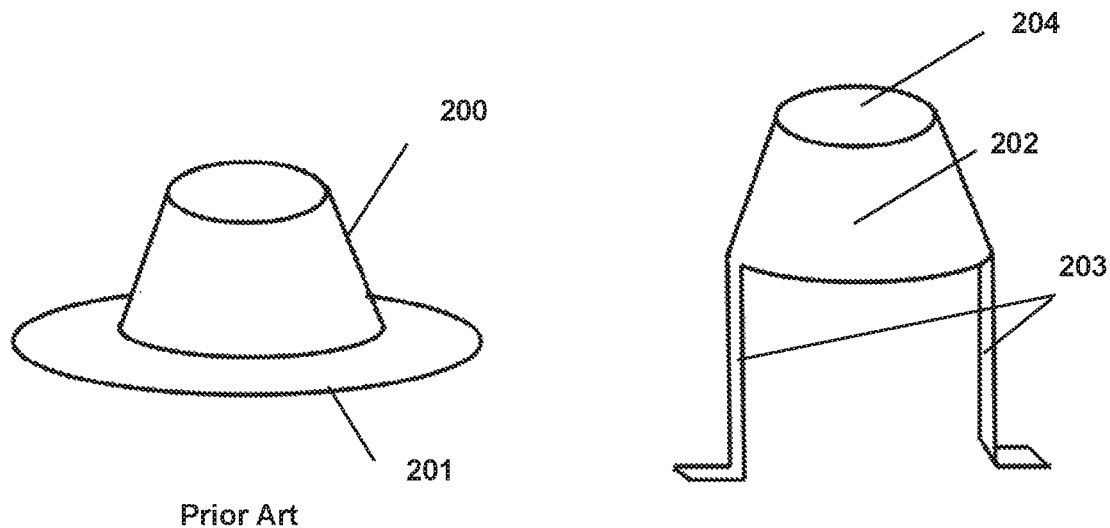
FIG. 2 depicts two types of electrodes of an accelerating region of the time-of-flight mass analyzer, according to an example embodiment of the invention.

The ion optical system of the time-of-flight mass spectrometer, or mass analyzer, usually comprises a stack of single electrodes that are used to create electric fields that accelerate ions introduced in the ion optical system. The electrodes may be metallic electrodes or may be made also with other non-conductive material with a conductive coating. In particular, the acceleration electrodes of the ion source of the ion optical system are often built in this way. Each of these electrodes is usually shaped as a nearly conical section 200 (see FIG. 2) with an outer circular crown 201 because it is easy to manufacture and to assemble in the ion source. Such a design is disclosed for example in FIG. 15 of [4] and it is illustrated to the left side in FIG. 2. FIG. 2 depicts two types of electrodes of the accelerating region of the time-of-flight mass analyzer. To the left in FIG. 2 is the typical design used in such instruments, according to prior art. To the right side in FIG. 2 is the structure according to the present invention. In prior art, these electrodes are formed and stacked on top of each other. Manufacturing and assembly methods include but are not limited to: mounting said electrodes on threaded rods and separating them using insulator parts, or brazing said electrodes directly together with ceramic insulators in between [5] [6]. All these mechanical designs have in common that each pair of neighboring electrodes forms approximately parallel surfaces that are akin to a capacitor. This is particularly critical because said acceleration electrodes lie very close to the electrode or electrodes of the ion source where the pulse is applied to extract the ions in the time-of-flight path, as shown for example in FIG. 1. Therefore, these parallel surfaces make the instrument susceptible to pick up the high-frequency component of the noise generated by the pulse or pulses applied to the extraction region, and by minimizing the amount of parallel surfaces, as shown in the illustration on the right side in FIG. 2, while preserving the compatibility with manufacturing constraints and fulfilling the requirements of generating appropriate electric fields to accelerate the ions, one can significantly improve the performance, for example the sensitivity, of a time-of-flight mass analyzer.

Figure 2A:
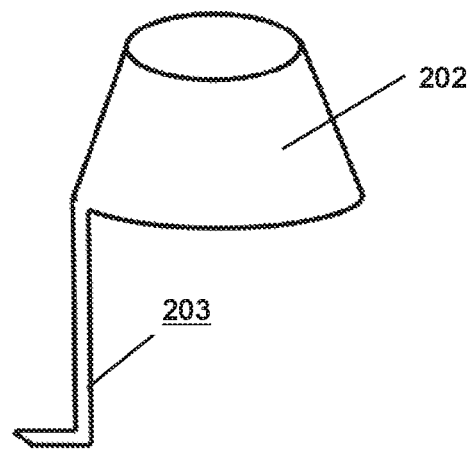
FIG. 2A illustrates an electrode with a single thing leg, according to an example embodiment of the invention.

The present invention discloses a mechanical design which reduces the inherent capacity between the electrodes and is at the same time very easy to assemble. Specifically, the present invention allows to remove the outer circular crown, such as outer circular crown 201, that is typically found in the acceleration electrodes used in the ion source of a time-of-flight mass analyzer, thus reducing the amount of parallel surfaces and the resulting capacitive load of the assembly, while surprisingly providing a convenient way to assemble such electrodes, particularly for a small-size ion source or a compact instrument. The outer circular crown has no functional role in providing a good electric field, but is only found there for the purpose of ease of manufacturing and assembly of said electrodes. According to the present invention, such outer circular crown can be removed and replaced by using an electrode with a nearly conical section shape 202 to which at least a thin legs 20 is attached as shown to the right of FIG. 2. It is understood that there may be one or more legs 203 for each electrode, but that preferably 2 legs are used, as shown in the example illustrated in the right part of FIG. 2. In FIG. 2A an example of an electrode with a single thing leg 203 is illustrated. Two or more thin legs 203 may be used to increase mechanical stability. Returning now to FIG. 2, the thin legs 203 function both as mechanical support of the conical section 202 and as electrical connections to apply to the electrode the desired potential. A top circular surface 204 of the conical section 203 may be open or may be closed with one or more grids. To the electrodes, either a constant or varying potential can be applied. In the case where the electrodes act as extraction electrodes, a high voltage pulse as described earlier can be applied to it.

Figure 2B:
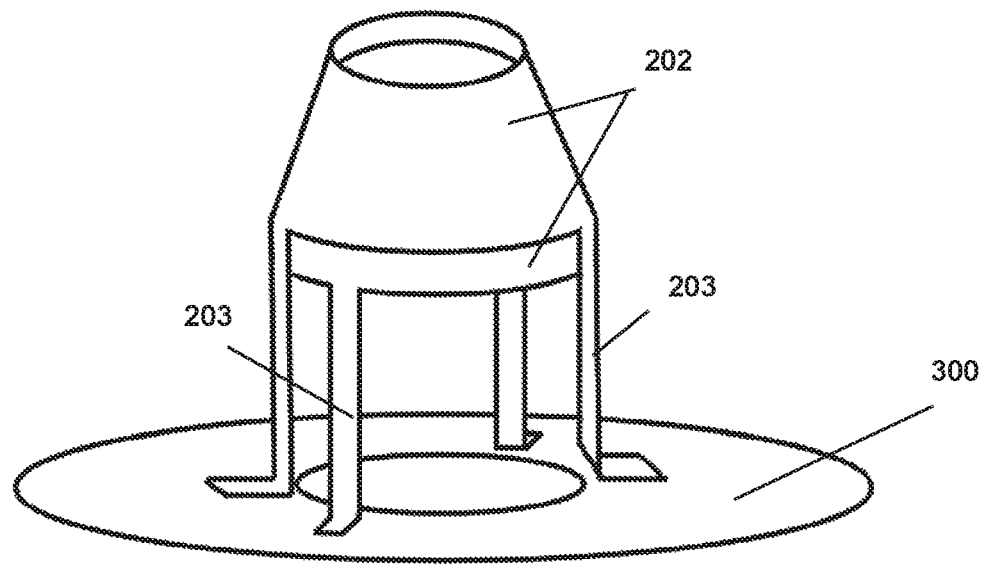
FIG. 2B illustrates a plurality of electrodes mounted on a support according to an example embodiment of the invention.

A plurality of these electrodes, with legs 203 of increasing length from one electrode to the next, may then be slid into an insulating tube to provide a concentric set of acceleration electrodes by properly positioning of the conical section 202 of the electrodes at appropriate distances, whereby appropriate means that the position of such conical section 202 is according to the one that gives the desired electric field, for example as determined with a simulation of the ion optics of the system. A precise positioning of the conical sections 202 of the electrodes may be obtained by using a set of electrodes with different leg sizes, so that the length of the leg 203 determines the position of the conical section 203 of the electrode when all the electrodes are mounted on a same support, acting as a reference plane. This is illustrated in the example of FIG. 2B, where 2 electrodes having different leg sizes between each other, are mounted on a support 300. Not only this concept allows to reduce the amount of parallel surfaces compared to having full planar surfaces as it is usually done according to prior art, but also it surprisingly leads to a much simpler and fast assembly of this element of the ion optical system, thus allowing for mass production at very low cost. More specifically, it is not necessary anymore to stack many electrodes and insulators on top of each other, with some of these parts being very small in the case of a compact instrument, but it is now sufficient to slide the electrode parts into the insulating tube to very easily obtain a precisely aligned stacked electrode system.

In another aspect, the present invention relates to a device for the filtering of any residual noise that might be left in the ion optical system despite all efforts made to reduce it, such as described in the previous aspect. The noise may be reduced by applying noise filters implemented on printed circuit boards, which, to be most effective, need to be as close as possible to the source of the noise, that is as close as possible to the electrodes inside the vacuum chamber enclosing the time-of-flight mass analyzer. However, connecting printed circuit boards to the small electrodes of a compact time of flight analyzer is a further complication that increases the complexity of manufacturing and assembly, hence the cost, of the system. Moreover, it increases the volume of the mass analyzer, hence the volume of the vacuum chamber that encloses it, hence the size and weight of the instrument.

Figure 3:
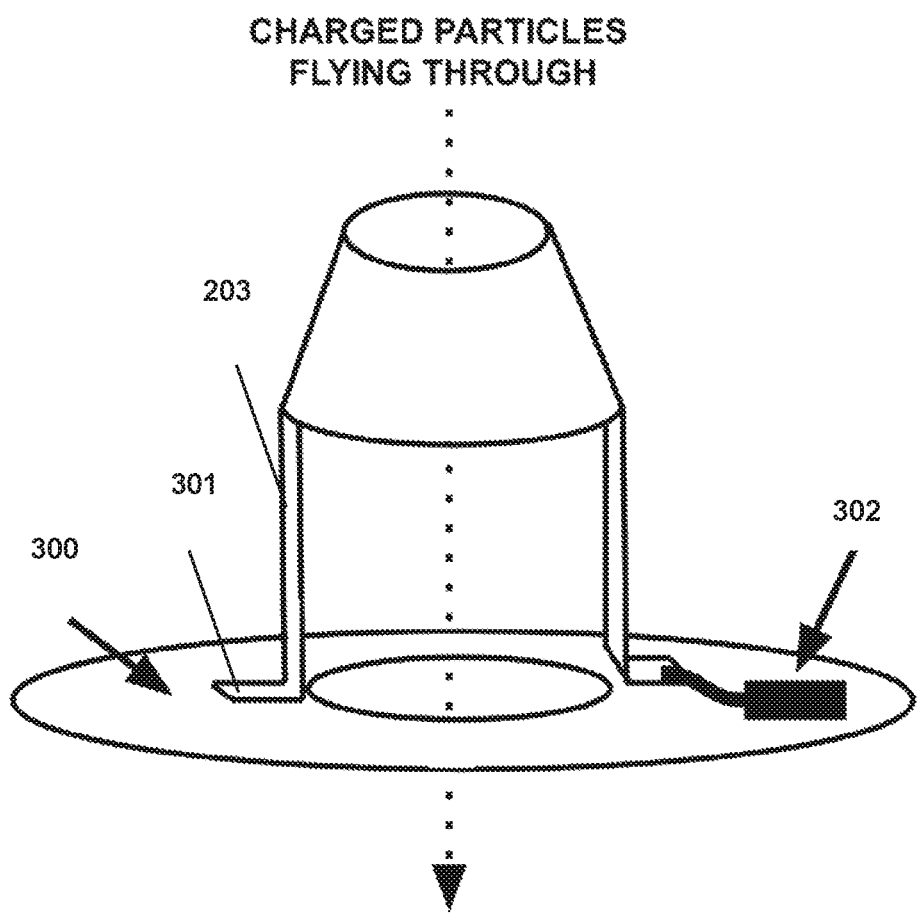
FIG. 3 depicts one way to mount electrodes on a printed circuit board according to the invention.

The present invention discloses an integrated design of the acceleration electrodes described in the previous aspect, that uses a printed circuit board as the support 300 (see FIG. 3), both as a structural element to attach a tip 301 of the thin legs 203 of the electrodes and as an electrical support for the implementation of a noise filter 302. This design is shown in FIG. 3, for one electrode. FIG. 3 depicts one way to mount electrodes on the printed circuit board 300 according to the invention, including the implementation of the noise filter 302 on the same surface that acts as mechanical support for the electrode.

Figure 3A:
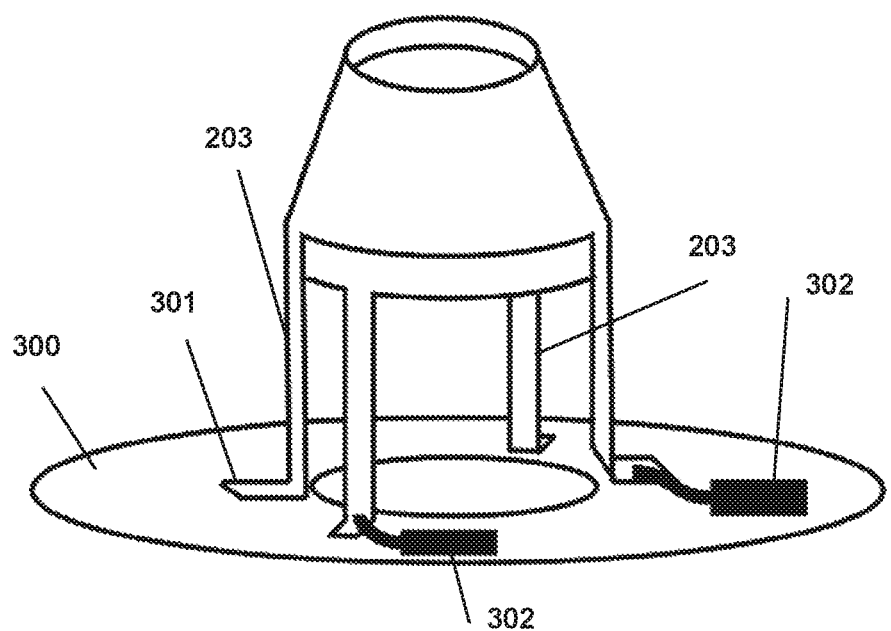
FIG. 3A show a plurality of electrodes each similar to that of FIG. 3, but mounted in a similar manner as the electrodes in FIG. 2B, according to an example embodiment of the invention.

An arbitrary number of electrodes may be mounted on the same printed circuit board, by using electrodes with legs of different length, and by mounting each subsequent electrode at a certain angle with respect to the previous one. One further example embodiment, comprising 2 electrodes, similar as in FIG. 2B, is illustrated in FIG. 3A, with each electrode being connected to a respective noise filter 302.

The invention according to the various aspects discussed herein above may be used to mount not only the acceleration electrodes, but also the extraction electrode of the ion source, which would be the first of the stack of electrodes. In a preferred embodiment, all the five electrodes of the ion source, one of them being the extraction electrode, are mounted in this way. Each or a selection of said electrodes may be equipped with its own filter, with the exception of the extraction electrode to where the pulse is applied, where the implementation of the noise filter is not appropriate. This makes it possible to implement noise filters on electrodes of the ion source of a compact time-of-flight mass spectrometer as close as possible to the electrodes, thus maximizing the effectiveness of said noise filter.

REFERENCES

[1] UPAC. Compendium of Chemical Terminology, 2nd ed. (the "Gold Book"). Compiled by A. D. McNaught and A. Wilkinson. Blackwell Scientific Publications, Oxford (1997). XML on-line corrected version: http://goldbook.iupac.org (2006-) created by M. Nic, J. Jirat, B. Kosata; updates compiled by A. Jenkins. ISBN 0-9678550-9-8. https://doi.org/10.1351/goldbook.

[2] Balsiger, H., Altwegg, K., Bochsler, P., et al. Rosina—Rosetta Orbiter Spectrometer for Ion and Neutral Analysis, Space Science Reviews, 128: 745-801, 2007. doi: https://doi.org/10.1007/s11214-006-8335-3.

[3] S. Scherer. Design of a high-performance Reflectron Time-of-Flight mass spectrometer for space applications. PhD thesis, University of Bern, Switzerland, 1999.

[4] Balsiger, H., Altwegg, K., Bochsler, P., et al. Rosina—Rosetta Orbiter Spectrometer for Ion and Neutral Analysis, Space Science Reviews, 128: 745-801, 2007. doi: https:doi.org/10.1007/s11214-006-8335-3.

[5] Balsiger, H., Altwegg, K., Bochsler, P., et al. Rosina—Rosetta Orbiter Spectrometer for Ion and Neutral Analysis, Space Science Reviews, 128: 745-801, 2007. doi: https://doi.org/10.1007/s11214-006-8335-3.

[6] Meyer, S., Tulej, M., Wurz, P., Mass spectrometry of planetary exospheres at high relative velocity: direct comparison of open- and closed-source measurements, Geosci. Instrum. Method. Data Syst., 6, 1-8, 2017, doi: https://doi.org/10.5194/gi-6-1-2017.

The invention claimed is:

1. A set of acceleration electrodes for the acceleration of charged particles in a vacuum ion optical system, each acceleration electrode comprises:
    a conical section; and
    an elongated leg protruding from the conical section, the elongated leg configured as a mechanical support and as an electrical connection between the conical section and a source for an electric potential.

2. The set of electrodes of claim 1, further comprising:
    an insulating tube configured to house the acceleration electrodes in sequence,
    wherein successive acceleration electrodes have legs of increasing length as compared to a preceding acceleration electrode in the sequence, and
    wherein the increasing length of the legs is configured to position the conical sections at determined distances among each other to obtain desired electrical fields between successive acceleration electrodes thereby providing a concentric set of acceleration electrodes.

3. The set of electrodes of claim 1, wherein the elongated legs of the respective ones of the set of acceleration electrodes are mounted on a same support, the same support acting as a reference plane.

4. The set of electrodes of claim 3, wherein the support onto which the set of electrodes is mounted includes a printed circuit board.

* * * * *